United States Patent
Yi et al.

(10) Patent No.: US 6,426,117 B1
(45) Date of Patent: Jul. 30, 2002

(54) METHOD FOR FORMING A THREE-COMPONENT NITRIDE FILM CONTAINING METAL AND SILICON

(75) Inventors: Kyoung Soo Yi; Won Yong Koh; Sang Won Kang, all of Taejon (KR)

(73) Assignee: Genitech Co., Ltd. (KR)

( * ) Notice: Subject to any disclaimer, the term of this patent is extended or adjusted under 35 U.S.C. 154(b) by 0 days.

(21) Appl. No.: 09/554,443

(22) PCT Filed: Sep. 10, 1999

(86) PCT No.: PCT/KR99/00534

§ 371 (c)(1),
(2), (4) Date: May 10, 2000

(87) PCT Pub. No.: WO00/16377

PCT Pub. Date: Mar. 23, 2000

(30) Foreign Application Priority Data

Sep. 10, 1998 (KR) ............................................. 98-37257
Nov. 16, 1998 (KR) ............................................. 98-48993

(51) Int. Cl.[7] ............................................................ C23C 16/34
(52) U.S. Cl. ............................ 427/255.394; 427/255.18
(58) Field of Search .................... 427/255.391, 255.393, 427/255.394, 255.18

(56) References Cited

U.S. PATENT DOCUMENTS

| | | | | |
|---|---|---|---|---|
| 4,390,393 A | * | 6/1983 | Ghezzo et al. ................. | 427/93 |
| 5,659,057 A | * | 8/1997 | Vaartstra ................... | 427/419.1 |
| 6,015,917 A | * | 1/2000 | Bhandari et al. ........ | 427/248.1 |
| 6,153,519 A | * | 11/2000 | Jain et al. ................... | 438/681 |
| 6,194,310 B1 | * | 2/2001 | Hsu et al. ................... | 438/643 |
| 6,214,423 B1 | * | 4/2001 | Lee et al. ................. | 427/255.6 |
| 6,287,965 B1 | * | 9/2001 | Kang et al. ................. | 438/648 |

* cited by examiner

Primary Examiner—Bret Chen
(74) Attorney, Agent, or Firm—Marger, Johnson & McCollom, P.C.

(57) ABSTRACT

A method for forming a three-component film containing metal, silicon and nitrogen for use in semiconductor devices on a substrate. The method of the present invention comprises the steps of: preparing separate reactive gases each including at least one selected from the group consisting of a gaseous metal compound, a gaseous silicon compound and an ammonia gas under conditions such that the gaseous meta compound and the ammonia gas does not form a mixture; determining a sequential gas supply cycle of the reactive gases so that supplies of the gaseous metal compound, the gaseous silicon compound and the ammonia gas are each included at least once within one gas supply cycle; and applying the reactive gases to the substrate by repeating the gas supply cycle at least once. According to the present invention, a three-component nitride film can be formed with a uniform thickness despite unevenness of a semiconductor substrate surface.

20 Claims, 1 Drawing Sheet a1 : Ar carrier gas bubbled in tetrakisdimethyamidotitanium b1 : Ar gas c1 : ammonia gas d1 : silane gas a1 : Ar carrier gas bubbled in tetrakisdimethyamidotitanium b1 : Ar gas c1 : ammonia gas d1 : silane gas a2 : Ar carrier gas bubbled in tetrakisdimethyamidotitanium mixed with silane gas b2 : Ar gas c2 : ammonia gas a3 : Ar carrier gas bubbled in tetrakisdimethyamidotitanium b3 : Ar gas c3 : mixture of ammonia gas and silane gas

METHOD FOR FORMING A THREE-COMPONENT NITRIDE FILM CONTAINING METAL AND SILICON

TECHNICAL FIELD

The present invention relates to a method for forming a film, and more particularly, to a method for forming a compound film of uniform thickness containing metal, silicon, and nitrogen for use in semiconductor devices on a substrate.

BACKGROUND ART

In the manufacture of semiconductor devices, a sputtered film of titanium nitride (TiN) is currently used as a diffusion barrier metal to prevent the diffusion of a metal interconnect into a silicon single crystal or an insulating layer. Additionally, the TiN is also used as a glue layer material to enhance adhesion when tungsten is used for forming an interconnect structure. However, a TiN film formed by sputtering or chemical deposition tends to have a columnar crystal structure, causing a problem that the metal interconnect material easily diffuses along its grain boundary. If a tungsten layer is formed on a TiN glue layer, the tungsten source gas $WF_6$ also easily diffuses along the grain boundary of the TiN layer to cause damage to the TiN glue layer.

Such problems can be alleviated by using a nanocrystalline material with extremely small grains or an amorphous material as a diffusion barrier material. A three-component nitride containing silicon and a refractory metal such as titanium, tantalum or tungsten is promising for such material.

With the trend to continue to miniaturize semiconductor integrated circuits to achieve submicron feature sizes, the width of an interconnect line becomes smaller and the aspect ratio of a contact hole becomes higher. Sputtering method is inadequate to form a film of a uniform thickness on such a structure because the method has a certain directivity. Accordingly, it is required that a uniform film of about 10 nm thickness is formed on a surface having holes of high-aspect ratio, that is, on an extremely uneven surface even using other deposition methods. Although chemical deposition is typically used to form a uniform thickness film, good step coverage can not be obtained under a chemical deposition condition that deposition sources react violently in gas phases. Particularly in the case of using alkylamido metal compound to chemically deposit a metal nitride film, the deposited metal nitride film has a bad step coverage due to the reaction between gaseous alkylamido metal compound and ammonia gas.

Unlike conventional chemical deposition methods where thin film sources are simultaneously supplied on a substrate, the sequential deposition method where the sources are sequentially supplied on a substrate enables formation of a uniform thickness thin film because it can be formed only by chemical reaction of the substrate surface. This method is well described in the following book; T. Suntola and M. Simpson eds., *Atomic Layer Epitaxy*, Blackie, London, 1990. However, the applications of this method have been limited to the formation of a two component film or a composite oxide film containing more than three components.

DISCLOSURE OF INVENTION

Accordingly, it is an object of the present invention to provide a method for forming a three-component nitride film containing metal and silicon for use in a barrier layer which effectively prevents the diffusion of metal interconnects of semiconductor devices.

Another object of the present invention is to provide a process by which a three-component nitride film containing metal and silicon is formed with a uniform thickness despite unevenness of a semiconductor substrate surface.

In order to accomplish the aforementioned object, the present invention provides a method for forming a three-component nitride film containing metal and silicon on a substrate, the method comprising the steps of: (a) preparing separate reactive gases each including at least one selected from the group consisting of a gaseous metal compound, a gaseous silicon compound and an ammonia gas under conditions such that the gaseous metal compound and the ammonia gas does not form a mixture; (b) determining a sequential gas supply cycle of the reactive gases so that supplies of the gaseous metal compound, the gaseous silicon compound and the ammonia gas are each included at least once within one gas supply cycle; and (c) applying the reactive gases to the substrate by repeating the gas supply cycle at least once.

The reactive gases include only five types of gases such as a gaseous metal compound, a gaseous silicon compound, an ammonia gas, a mixture of a gaseous metal compound and a gaseous silicon compound, a mixture of a gaseous silicon compound and an ammonia gas because gaseous metal compound and the ammonia gas react each other thus should not form a mixture.

BEST MODE FOR CARRYING OUT THE INVENTION

Figure 1A:
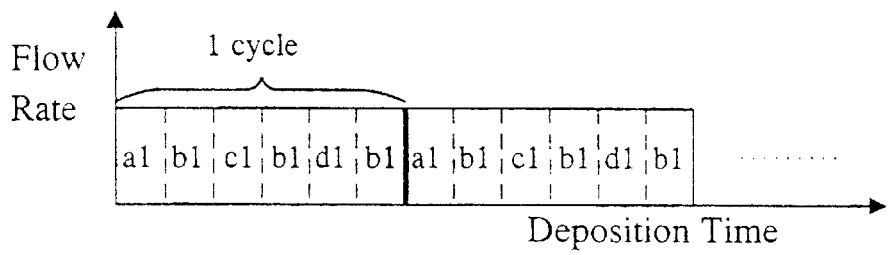
FIGS. 1A to 1C are graphs showing the gas supply cycles regardless of absolute magnitude in flow rate and deposition time according to the embodiments of the present invention.

In the embodiment of the present invention, various gas supply cycles can be determined as follows.

First, between the supplies of the reactive gases, supplies of a gas not reacting with any of the reactive gases are inserted. The respective reactive gas supplies of a gaseous metal compound, a gaseous silicon compound and an ammonia gas are preferably arranged in a cyclic permutation order, and supplies of a gas not reacting any of the three component gases are inserted therebetween. For example, the supply cycle may be determined to be "gaseous metal compound→non-reacting gas→gaseous silicon compound→non-reacting gas→ammonia gas→non-reacting gas" or "gaseous metal compound→non-reacting gas→ammonia gas→non-reacting gas→gaseous silicon compound→non-reacting gas", respectively. In the chemical deposition, such a supply cycle is repeated to form a film of desired thickness.

Second, because the reactive gases include gas mixtures, the respective supplies of reactive gases containing a gaseous metal compound and an ammonia gas are arranged within the supply cycle and supplies of a gas not reacting with any of the two reactive gases are inserted therebetween. Here, the reactive gas containing a metal compound may be a sole gaseous metal compound or a mixture of a gaseous metal compound and a gaseous silicon compound. Additionally, the same may be a reactive gas containing an ammonia gas. In this case, the supply cycle may be determined, for example, to be "mixture of a gaseous metal compound and a gaseous silicon compound→non-reacting gas→ammonia gas→non-reacting gas", "gaseous metal compound→non-reacting gas→mixture of an ammonia gas and a gaseous silicon compound→non-reacting gas", or "mixture of a gaseous metal compound and a gaseous silicon compound→non-reacting gas→mixture of an ammonia gas and a gaseous silicon compound→non-reacting gas", respectively. In the above methods of determining supply cycle, the non-reacting gas is supplied to prevent the reaction of reactive gases.

Third, a gaseous silicon compound, instead of a non-reacting gas, may be used to prevent the vapor reaction between a gaseous metal compound and an ammonia gas. Accordingly the supply cycle is determined by inserting a gaseous silicon compound between the respective supplies of the reactive gases containing a metal compound and ammonia. For example, the respective reactive gas supplies of a gaseous metal compound, a gaseous silicon compound and an ammonia gas are arranged in a cyclic permutation order, and supplies of a gaseous silicon compound are inserted therebetween. That is, the supply cycle may be "gaseous metal compound→gaseous silicon compound→ammonia gas→gaseous silicon compound". Instead of the above supply cycle, the supply cycle may be "mixture of a gaseous metal compound and a gaseous silicon compound→gaseous silicon compound→ammonia gas→gaseous silicon compound", "gaseous metal compound→gaseous silicon compound→mixture of an ammonia gas and a gaseous silicon compound→gaseous silicon compound", or "mixture of a gaseous metal compound and a gaseous silicon compound→gaseous silicon compound→mixture of an ammonia gas and a gaseous silicon compound→gaseous silicon compound". As described above, the supplies of reactive gases, such as a gaseous silicon compound, not reacting with other reactive gases can be inserted between the supplies of other reactive gases to prevent vapor phase reactions.

Fourth, the supply cycles can be differently determined to control the stoichiometric composition of a film during the deposition. The desired control of stoichiometric composition provides better matches of physical properties between the deposited film and the upper/lower layers thereof. Such physical properties include a contact resistance, a step coverage, etc. For example, in the case of depositing a three-component nitride film containing titanium and silicon on a silicon-rich underlayer, a silicon-rich film ($Ti_xSi_yN$, x<y) is deposited in the early stage of deposition to provide low contact resistance and then a titanium-rich film ($Ti_xSi_yN$, x>y) is deposited in the late stage of deposition to reduce the film resistance itself.

In order to form such a film, the supply cycle is determined to include supplies of gaseous silicon compound more than those of gaseous metal compound in the early stage of deposition whereas it is determined to include supplies of gaseous metal compound more than those of gaseous silicon compound in the late stage of deposition. For example, the supply cycle is determined to be "Si—N—Si—N—Ti—N—" in the early stage of deposition, "Si—N—Ti—N—" in the middle stage of deposition, "Si—N—Ti—N—Ti—N—" in the late stage of deposition, wherein Si is a gaseous silicon compound, N is an ammonia gas, and Ti is a gaseous titanium compound. In the above supply cycle, notation of non-reacting gas, which is supplied between the supplies of reactive gases, was omitted.

In some cases, the supply cycle may be "Si—N—Ti—N—Ti—N—Ti—N—Ti—N—" to lower the overall content of silicon in a deposited film while maintaining constant composition of silicon. In the embodiments, the metal included in the metal compound is preferably a refractory metal, and more preferably, the refractory metal is titanium, tantalum, or tungsten. Additionally, the metal compound may be an organometallic compound or a halogenated metallic compound. In the case of using an organometallic compound, it is preferably an amido or imido compound of a metal. More preferably, the amido compound of a metal is an amidotitanium compound and most preferably the amidotitanium compound is tetrakisdimethylamidotitanium or tetrakisdiethylamidotitanium.

Likewise, for example, if tantalum tris-diethylamido-t-butylimide is used as a metal source, a three-component nitride film containing tantalum and silicon can be obtained.

The silicon compound is preferably a compound comprised of hydrogen and silicon, which is represented by $Si_nH_{2n+n}$, wherein n is a natural number of not more than 5. Preferably, the non-reacting gas is $H_2$, He, $N_2$, or Ar.

In the chemical deposition step, the temperature of the substrate is preferably maintained lower than the thermal decomposition temperature of the metal compound to prevent the formation of a film with poor step coverage due to vapor phase reaction.

The present invention will be further described in the following examples and will be compared with other examples, but the present invention should not be construed as being limited thereto.

All the reactions were carried out in a reactor made of stainless steel. The pressure in the reactor during the deposition was 1 Torr. while the temperature of a silicon substrate contained in the reactor was maintained at 180° C. Tetrakisdimethylamidotitanium, a metallic source was fed to the reactor by bubbling an argon carrier gas at a temperature of 25° C. The temperature of gas supply line was maintained at 100° C. to prevent the condensation of the metallic source.

EXAMPLE 1

The cycle was comprised of sequential supplies of an argon carrier gas bubbled in tetrakisdimethylamidotitanium at a flow rate of 100 sccm for 5 seconds, an argon gas at a flow rate of 100 sccm for 10 seconds, an ammonia gas at a flow rate of 143 sccm for 5 seconds, an argon gas at a flow rate of 100 sccm for 10 seconds, a silane ($SiH_4$) gas at a flow rate of 38 sccm for 5 seconds, and an argon gas at a flow rate of 100 sccm for 10 seconds. The cycle was repeated by 200 times, as shown in FIG. 1A. Auger spectrum analysis of the deposited film indicated compositions of titanium, nitrogen, silicon, carbon. and oxygen with their specific peaks.

EXAMPLE 2

Figure 1B:
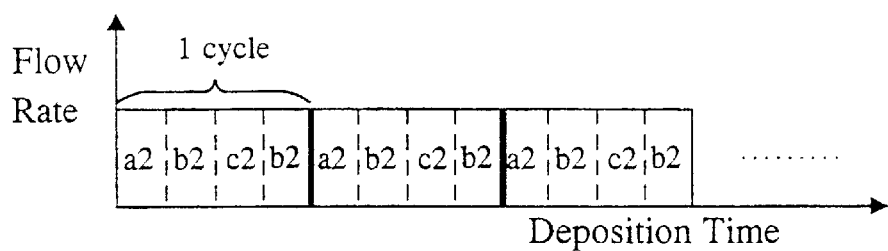

The cycle was comprised of sequential supplies of an argon carrier gas bubbled in tetrakisdimethylamidotitaniun at a flow rate of 91 sccm mixed with a silane gas at a flow rate of 9 sccm for 5 seconds, an ammonia gas at a flow rate of 143 sccm for 5 seconds, and an argon gas at a flow rate of 100 sccm for 10 seconds. The cycle was repeated by 200 times, as shown in FIG. 1B. Auger spectrum analysis of the deposited film indicated compositions of titanium, nitrogen, silicon, carbon, and oxygen with their specific peaks.

EXAMPLE 3

Figure 1C:
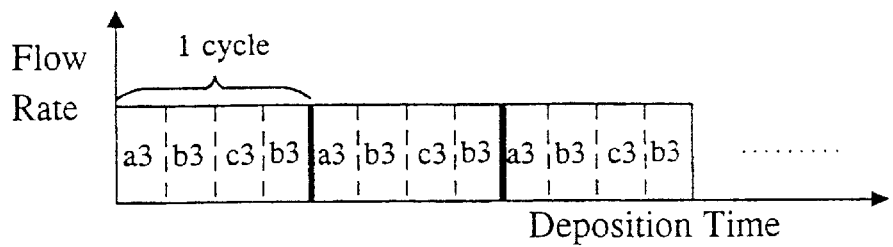

The cycle was comprised of sequential supplies of an argon carrier gas bubbled in tetrakisdimethylamidotitanium at a flow rate of 100 sccm for 5 seconds, an argon gas at a flow rate of 100 sccm for 10 seconds, an ammonia gas at a flow rate of 13 sccm mixed with a silane gas at a flow rate of 38 sccm for 5 seconds, and an argon gas at a flow rate of 100 sccm for 10 seconds. The cycle was repeated by 200 times, as shown in FIG. 1C. Auger spectrum analysis of the deposited film indicated compositions of titanium, nitrogen, silicon, carbon, and oxygen with their specific peaks.

COMPARATIVE EXAMPLE 1

The cycle was comprised of sequential supplies of an argon carrier gas bubbled in tetrakisdimethylamidotitanium at a flow rate of 100 sccm for 5 seconds, an argon gas at a flow rate of 100 sccm for 10 seconds, a silane gas at a flow rate of 38 sccm for 5 seconds, and an argon gas at a flow rate of 100 sccm for 10 seconds. The cycle was repeated by 200 times, and no film, however, was formed on the silicon substrate.

COMPARATIVE EXAMPLE 2

The cycle was comprised of sequential supplies of an ammonia gas at a flow rate of 143 sccm for 5 seconds, an argon gas at a flow rate of 100 sccm for 10 seconds, a silane gas at a flow rate of 38 sccm for 5 seconds, and an argon gas at a flow rate of 100 sccm for 10 seconds. The cycle was repeated by 200 times, and no film, however, was formed on the silicon substrate.

The comparative examples show that reactive gases of a gaseous metal compound, a gaseous silicon compound and an ammonia gas each should be included at least once within the gas supply cycle to form a three-component nitride film containing metal and silicon.

What is claimed is:

1. A method for forming a three-component nitride film containing metal and silicon on a substrate, said method comprising:
   (a) preparing separate reactive gases each including at least one selected from the group consisting of a gaseous metal compound, a gaseous silicon compound and an ammonia gas under conditions such that the gaseous metal compound and the ammonia gas do not form a mixture;
   (b) effecting a sequential gas supply cycle of said reactive gases so that supplies of said gaseous metal compound, said gaseous silicon compound and said ammonia gas are each included at least once within one gas supply cycle under conditions such that the gaseous metal compound and the ammonia gas do not form a mixture; and
   (c) applying said reactive gases to said substrate by repeating said effecting at least once, thereby performing a chemical vapor deposition to form a three-component nitride film containing metal and silicon.

2. The method of claim 1, wherein said one gas supply cycle comprises supplies of a gas not reacting with any of said reactive gases, each supply being inserted between the supplies of said reactive gases.

3. The method of claim 2, wherein the respective supply cycles are determined to include different times of reactive gas supplies to change the stoichiometric composition of said three-component nitride film, providing matches of physical properties between said three-component nitride film and upper/lower layers thereof.

4. The method of claim 3, wherein said chemical vapor deposition step is conducted by repeating supply cycles, said supply cycles each including relatively more gaseous silicon compound supplies in the early stage of said deposition step while said supply cycles each including more gaseous metal compound supplies in the late stage of said deposition step, to reduce the contact resistance between said three-component nitride film and the upper/lower layers thereof.

5. The method of claim 2, wherein said one supply cycle comprises supplying a gaseous metal compound, a gaseous silicon compound and an ammonia gas in a cyclic order, with supplies of a gas not reacting any of the three component gases between said reactive gas supplies.

6. The method of claim 2, wherein said gas not reacting with any of said reactive gas is selected from the group consisting of $H_2$, He, $N_2$, and Ar.

7. The method of claim 1, wherein said one supply cycle comprises supplying reactive gases containing a gaseous metal compound and an ammonia gas with supplies of a gas not reacting with any of said two reactive gases therebetween.

8. The method of claim 1, wherein said one supply cycle comprises supplying reactive gases containing a gaseous metal compound and an ammonia gas with supplies of a gaseous silicon compound therebetween.

9. The method of claim 1, wherein said one supply cycle comprises supplying a gaseous metal compound, a gaseous silicon compound and an ammonia gas in a cyclic order, with supplies of a gaseous silicon compound therebetween.

10. The method of claim 1, wherein said metal is selected from the refractory metal group consisting of titanium, tantalum and tungsten.

11. The method of claim 1, wherein said metal compound is an organometallic compound.

12. The method of claim 11, wherein said organometallic compound includes at least one amido or imido group.

13. The method of claim 12, wherein said amido-metallic compound is an amidotitanium compound.

14. The method of claim 13, wherein said amido-titanium compound is tetrakisdimethylamnidotitanium or tetrakisdiethylamidotitanium.

15. The method of claim 12, wherein said organometallic compound is tantalum tris-diethylamido-t-butylimide.

16. The method of claim 1, wherein said metal compound is a halogenated metallic compound.

17. The method of claim 1, wherein said silicon compound is a compound comprised of hydrogen and silicon. which is represented by $Si_nH_{2n-2}$, wherein n is a natural number of not more than 5.

18. The method of claim 1, wherein the temperature of said substrate is maintained lower than the thermal decomposition temperature of said metal compound during chemical deposition.

19. A method for forming a three-component nitride film containing metal and silicon on a substrate, said method comprising:
   sequentially supplying reactive gases to a semiconductor substrate, said reactive gases each including at least one of or mixtures of a gaseous metal compound, a gaseous silicon compound and an ammonia gas without a mixture of the gaseous metal compound and the ammonia gas in a single gas supply cycle to form a three-component nitride film containing metal and silicon,
   wherein the supply of said gaseous metal compound, said gaseous silicon compound and said ammonia gas are each included at least once within the single gas supply cycle under conditions such that the gaseous metal compound and the ammonia gas do not form a mixture.

20. The method of claim 19, further comprising repeating the single cycle one or more times.

* * * * *

UNITED STATES PATENT AND TRADEMARK OFFICE
CERTIFICATE OF CORRECTION

PATENT NO.    : 6,426,117 B1
DATED         : July 30, 2002
INVENTOR(S)   : Yi et al.

It is certified that error appears in the above-identified patent and that said Letters Patent is hereby corrected as shown below:

Column 6,
Line 33, "amidotitanium" should read -- amido-titanium --;
Line 43, "$Si_nH_{2n-2}$" should read -- $Si_nH_{2n+2}$ --.

Signed and Sealed this

Fifteenth Day of April, 2003

JAMES E. ROGAN
*Director of the United States Patent and Trademark Office*